United States Patent [19]
Das et al.

[11] Patent Number: 5,962,196
[45] Date of Patent: Oct. 5, 1999

[54] DEEP ULTRAVIOLET LIGHT PHOTORESIST PROCESSING

[75] Inventors: Siddhartha Das; Harry H. Fujimoto, both of Sunnyvale; Henry Gaw, San Jose, all of Calif.

[73] Assignee: Intel Corporation, Santa Clara, Calif.

[21] Appl. No.: 08/135,324

[22] Filed: Oct. 13, 1993

Related U.S. Application Data

[63] Continuation of application No. 07/887,408, May 19, 1992, which is a continuation of application No. 07/682,574, Apr. 8, 1991.

[51] Int. Cl.⁶ .................................................. G03C 5/00
[52] U.S. Cl. .......................................... 430/330; 430/309
[58] Field of Search .................................. 430/330, 296, 430/311, 313, 309

[56] References Cited

U.S. PATENT DOCUMENTS

| | | | |
|---|---|---|---|
| 4,348,473 | 9/1982 | Okumura et al. | 430/296 |
| 4,386,152 | 5/1983 | Lai | 430/269 |
| 4,775,609 | 10/1988 | McFarland | 430/325 |
| 4,885,232 | 12/1989 | Spark | 430/330 |
| 4,921,778 | 5/1990 | Thackeray et al. | 430/330 |
| 4,992,356 | 2/1991 | Jeffries, III et al. | 430/330 |
| 5,019,448 | 5/1991 | Mammato et al. | 430/330 |
| 5,019,488 | 5/1991 | Mammato | 430/325 |

FOREIGN PATENT DOCUMENTS

| | | | |
|---|---|---|---|
| 0142637 | 9/1982 | Japan | 430/330 |
| 0054412 | 6/1982 | United Kingdom . | |

OTHER PUBLICATIONS

Nalamasu, et al., "Development of a Chemically Amplified Positive (CAMP) Resist Material for Single Layer Deep–UV Lithography", 1990, pp. 32–48.

Nalamasu, et al., "Preliminary Llithographic Characteristics of an All–organic Chemically Amplified Resist Formulation for Single Layer Deep–UV Lithography", 1991, pp. 13–25.

MacDonald, et al., "Airborne Chemical Contamination of a Chemically Amplified Resist", 1991, pp. 2–12.

*Primary Examiner*—Thorl Chea
*Attorney, Agent, or Firm*—Blakely, Sokoloff, Taylor & Zafman

[57] ABSTRACT

Process for post exposure treatment of a latent image on a semiconductor wafer. After a deep ultraviolet (UV) photoresist has been exposed, the wafer, including the latent image in the attached photoresist, is maintained in an inert gas to protect the resist from the air atmosphere. Then the latent image is baked to stabilize the image.

9 Claims, 6 Drawing Sheets

0.4um LINES/SPACES

NO DELAY 0.4um LINES/SPACES

2 HOUR DELAY IN CLEANROOM AMBIENT 0.4um LINES/SPACES

1 HOUR DELAY IN NITROGEN 0.4um LINES/SPACES

2 HOUR DELAY IN NITROGEN

DEEP ULTRAVIOLET LIGHT PHOTORESIST PROCESSING

This is a continuation of application Ser. No. 07/887,408, filed May 19, 1992, which a continuation of application Ser. No. 07/682,574, filed Apr. 8, 1991.

FIELD OF THE INVENTION

The present invention relates to the field of semiconductor fabrication; particularly to the area of post exposure photoresist processing.

BACKGROUND OF THE INVENTION

The fundamental steps involved in the process of fabricating a semiconductor wafer are well-known in the prior art. Generally, the wafer begins as a blank substrate. Patterns are placed on layers formed on the wafer using well-known photolithographic techniques. Typically, the application of this pattern to the wafer is accomplished using photoresist technology. The photoresist is placed on the layer which is to be patterned and then exposed to light through a mask. The mask contains a "picture" of the image consisting of clear and opaque designs. These designs constitute the pattern to be created in the photoresist film and, through etching, onto the underlying layer.

When the photoresist is exposed to light the picture, or latent image, is created in the photoresist. The latent image is the replication of the photo intensity distribution in the exposed photoresist, constituting the pattern for the design that is to be etched into the underlying layer. The regions in the photoresist that are exposed to light are made either soluble or insoluble in a developer solution. In many cases, a post exposure bake step is required after exposure to create a solubility discrimination between the exposed and unexposed regions of the photoresist. If the exposed regions are soluble, a positive image of the mask is created on the substrate. These photoresists are referred to as positive resists. If the non-exposed areas dissolve in the developer, a negative image results. These photoresists are referred to as negative resists.

Photoresists are also characterized by the actinic (absorbing) wavelength used during exposure. Generally three categories exist. Resists exposed to ultraviolet (UV) with a wavelength between 360–700 nanometers (nm) are near-UV resists. Resists which are exposed to UV radiation having wavelengths between 300–360 nm are referred to as Mid-UV resists. Finally, resists which are subjected to and photo-react to UV radiation with wavelengths of between 100–300 nm are referred to as Deep-UV resists. Using shorter wavelengths produces better resolution.

Furthermore, some resist systems utilize strong photoacids to catalyze a reaction to increase or decrease solubility of the exposed regions in positive resists or negative resists respectively. To facilitate the catalytic reaction, the wafer is post exposure baked (PEB) after exposure has created a latent image in it. However, a problem can arise where the time interval between exposure of the photoresist and baking of the resist is too long and the wafer sits in a clean room ambient. In this case, the acid used as a catalyst is neutralized. Thus, the acid at the surface of the photoresist will not be effective and the photoresist portion exposed to the atmosphere at the surface of the photoresist becomes insoluble. Hence, once the photoresist is subjected to developer, the developer solution diffuses beneath the insoluble portion of the resist and dissolves the soluble portion of the exposed resist. As a result, a cave-like pattern is created on the wafer and the image created as a result of the lithography process does not have a fine resolution.

The present invention overcomes this problem by avoiding the effects of the clean room ambient during the post exposure period. Furthermore, the present invention allows the time between exposure and baking to be increased, while protecting the image.

SUMMARY OF THE INVENTION

A process for the post exposure treatment of a latent image on a semiconductor wafer is described. The image is the result of exposure of a positive photoresist affixed to the wafer. After exposure, the wafer is maintained in an inert medium to ensure that the latent image remains stable. The completion steps of the fabrication process include the post exposure baking and development of the latent image. The latent image is stabilized by baking the wafer.

In one embodiment, the inert medium can be nitrogen gas. In another embodiment, the wafer can be maintained in water. In another embodiment, the wafer can be maintained in nitrogen during the exposure of the wafer. Finally, the nitrogen or other inert atmospheric conditions can also be employed to regenerate the surface of the latent image after it has been subjected to the normal clean room ambient.

BRIEF DESCRIPTION OF THE DRAWINGS

The present invention will be understood more fully from the detailed description given below and from the accompanying drawings of the preferred embodiments of the invention which, however, should not be taking to limit the invention to a specific embodiment but are for explanation and understanding only.

DETAILED DESCRIPTION OF THE INVENTION

A process for post exposure treatment of a latent image on a semiconductor wafer is described. In the following description, numerous specific details are set forth, such as specific film thicknesses, wave lengths, etc, in order to provide a thorough understanding of the present invention, it will be obvious, however, to one skilled in the art that the present invention may be practiced without these specific details. In other instances, well-known processing steps are not set forth in detail in order not to unnecessarily obscure the present invention.

Figure 1:
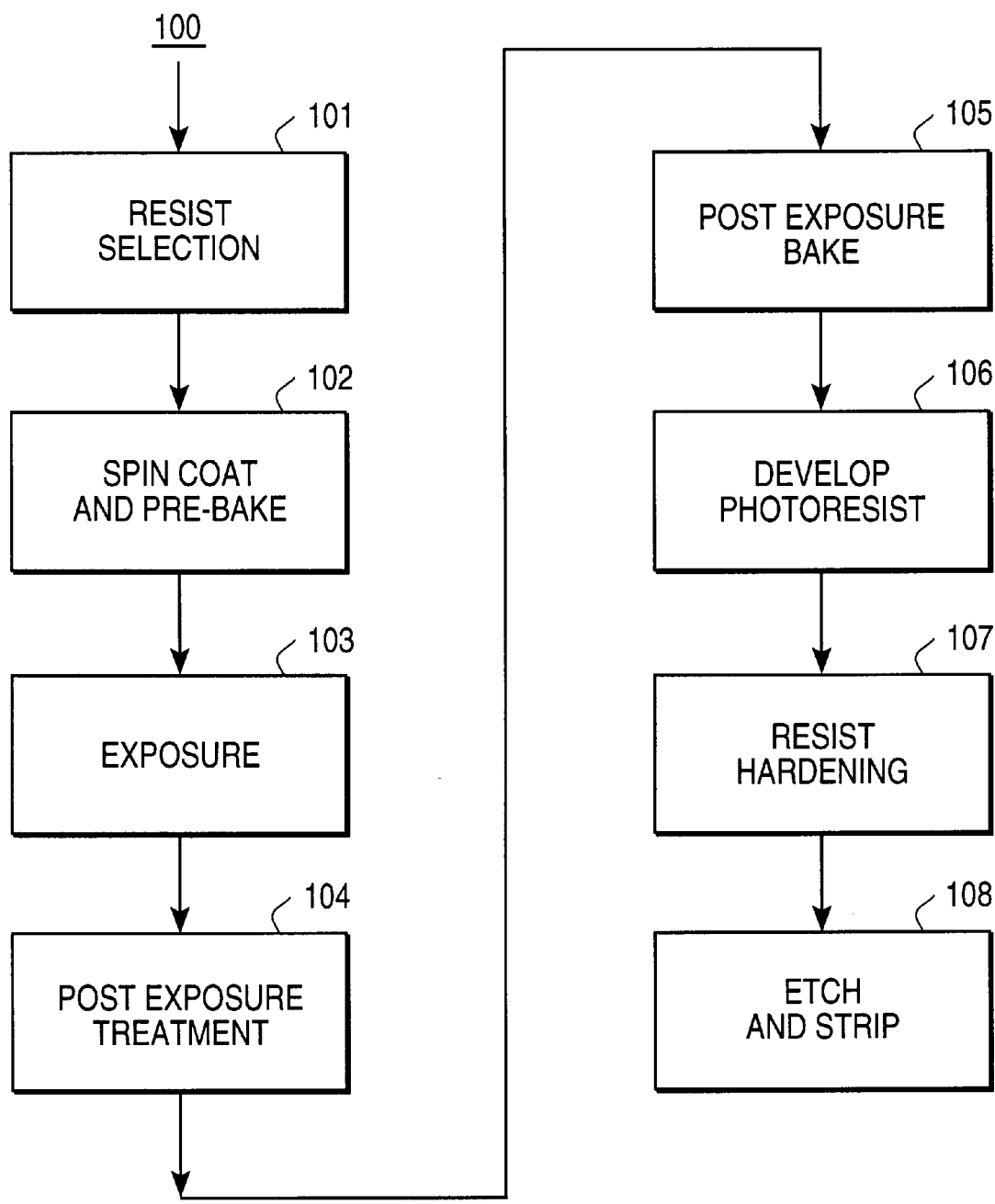
FIG. 1 illustrates a block diagram flowchart of the photolithography process of the present.

In FIG. 1, the lithography process 100 for the present invention is depicted in block diagram format. Before lithography process 100 begins, the wafer surface is cleaned to eliminate any dirt which would create poor adhesion and defects. A moist atmosphere can be absorbed readily by wafer surfaces. This moisture also can cause poor adhesion. Therefore, a dehydration baking step is needed before printing and coating the wafer with a photoresist. Subsequent to cleaning and dehydration, the wafer is normally primed with a pre-resist coating to improve adhesion. Following the cleaning, dehydration bake and priming, the wafer is ready to be coated with the photoresist.

The first step of lithography process 100 is resist selection, stage 101. The photoresist of the present invention is defined according to its resist chemistry. Un the currently preferred embodiment, the photoresist is a positive photoresist. The resist chemistry of the present invention has two characteristics. First, the photoresist system utilized must rely on the use of a strong acid. Second, the present invention utilizes systems which rely on an acid catalytic mechanism wherein small quantities of acid are used to render resins more soluble for positive resists (and less soluble for negative resists). In the currently preferred embodiment, two possible types of positive resist systems are processed. First, it utilizes a two component deep UV resist system consisting of a phenolic resin with a blocking (protecting) group. Examples of such are poly (4-tert-butyloxycarbonyloxystyrene) and a photo acid generator (PAG), respectively. Examples of the photoacid generator for the present invention are onium salts or tosylates. A three component deep UV resist system consisting of phenolic resin, a dissolution inhibitor, and a photoacid generator may also be utilized. En either case, the resin may be phenolic or phenolic-based copolymers or polymer blends. An I-line UV resist system exposed to wavelengths which are approximately 365 nanometers (nm) may also be employed. If the present invention utilizes a negative resist, the strong acid must catalyze cross-linking which renders the resins less soluble in the developer.

Once resist selection 101 has been completed, spin coat and pre-bake stage 102 begins. Spin coat and pre-bake stage 102 consists of two separate processes: coating and pre-baking. The coating process produces a uniform defect-free polymeric film of desired thickness over the entire wafer. Spin coating is the most widely used technique to apply the photoresist film. This procedure is carried out by dispensing one of the resist solutions described above onto the wafer surface and then rapidly spinning the wafer until the resist is essentially dry. Next, a soft-bake or pre-baked process is performed on the wafer. The purposes of the soft-bake are to remove solvents from the spun-on resist by driving them off, to improve the adhesion of the resist so it attaches better during the developing stage, and to anneal the stress caused by the sheer force encountered in the spinning process.

Once the positive resist has been affixed to the wafer, process 100 continues with the exposure stage 103. The wafer is exposed to radiation in order to create a latent image in the resist. The degree of exposure is adjusted by controlling the energy impinging on the resist, which is a product of the intensity of the source and the time of the exposure. In the currently preferred embodiment, a stepper/scanner exposure system is used in conjunction with an excimer laser or a high pressure mercury (Hg) lamp to provide the necessary radiation. The excimer laser exposes the wafer to deep UV radiation of a wave length of 248 nanometers (nm). Upon exposure to deep UV radiation, the FAG generates a catalytic amount of the strong acid. Upon post exposure baking (PEB), the strong acid removes the protection the resin receives from the blocking group, rendering it alkaline-soluble. Being alkaline soluble produces a dissolution selectivity between exposed regions and unexposed regions of the resist in alkaline developers. Thus, exposure radiation removes or renders ineffective the inhibitor to free the phenolic resin. The phenolic resin will then rapidly dissolve in the developer. In the case of negative resists, the strong acid catalyzes cross-linking. During the PEB, the exposed regions are rendered insoluble in the alkaline developer.

Figure 2A:
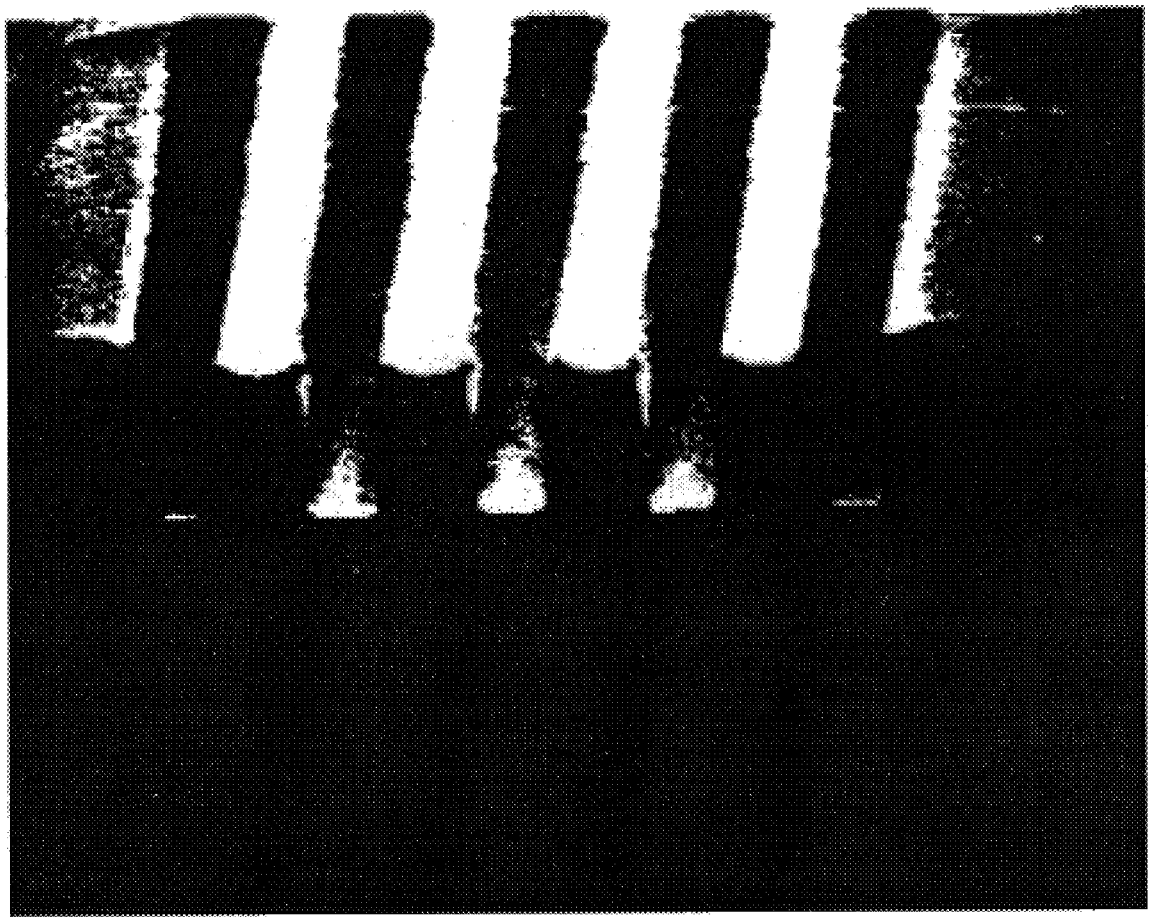
FIG. 2A illustrates the effect of the clean room ambients on the latent image of the exposed photoresist with no delay between exposure and post-exposure bake.
Figure 2B:
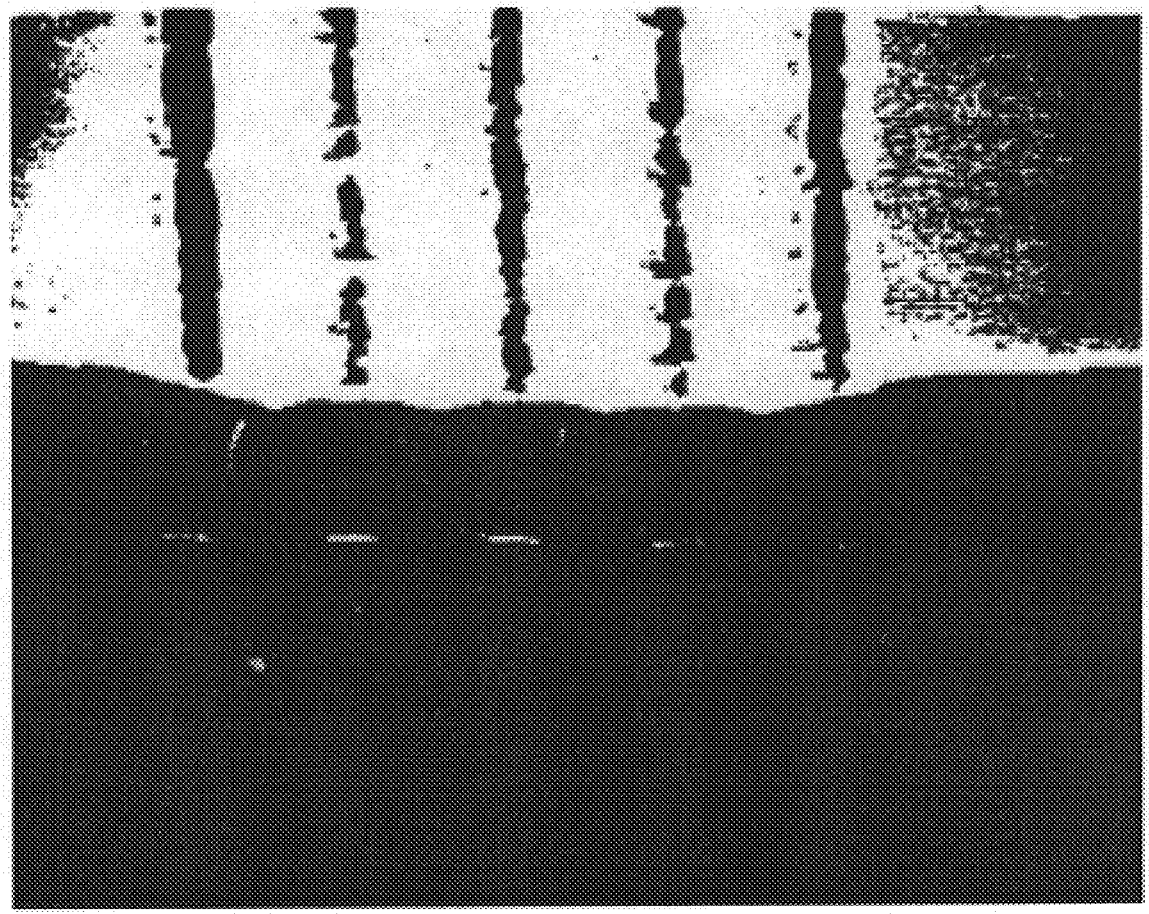
FIG. 2B illustrates the effect of the clean room ambients on the latent image of the exposed photoresist with a 2 hour delay between exposure and post-exposure bake.
Figure 2C:
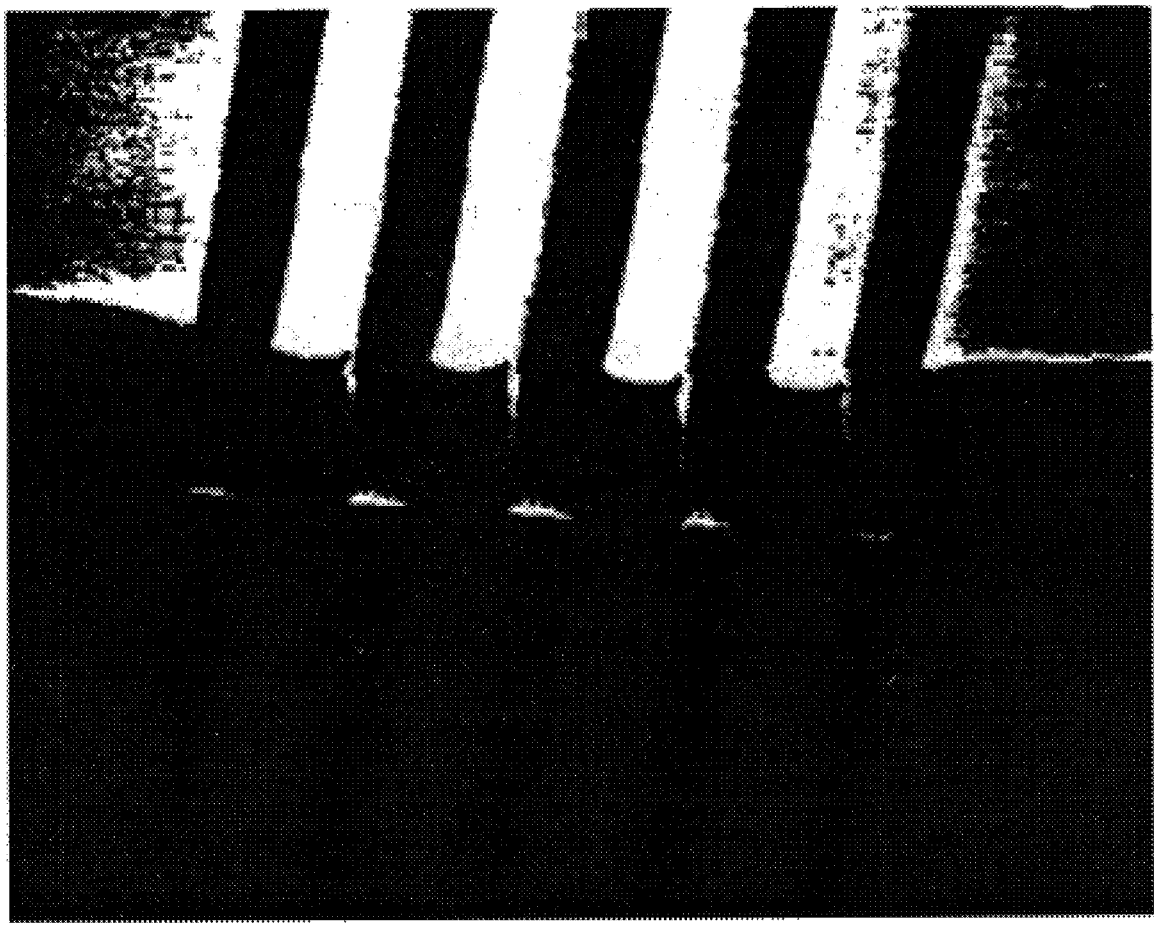
FIG. 2C illustrates the effect of a nitrogen ambient on the latent image of the exposed photoresist with a 1 hour delay between exposure and post-exposure bake.
Figure 2D:
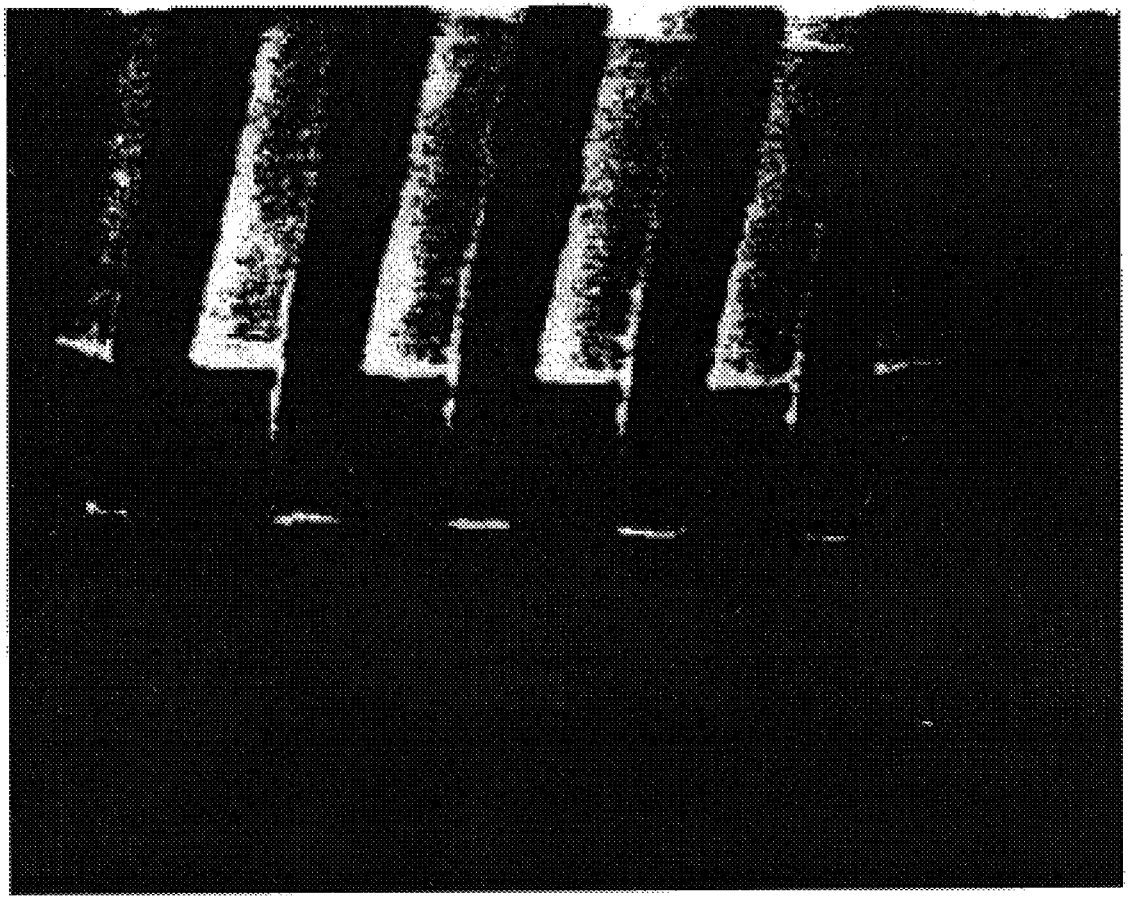
FIG. 2D illustrates the effect of nitrogen ambient on the latent image of the exposed photoresist with a 1 hour delay between exposure and post-exposure bake.

Once exposure stage 103 is complete, the photoresist releases a strong acid which catalyzes a reaction which enhances solubility of the exposed regions. If the wafer is left in an open air environment, the acid neutralizes, such that it is not an effective catalyst. FIG. 2B illustrates the effect a clean room ambient has on the latent image. In this case, no deprotection occurs at the surface of the exposed photoresist, and this region will be insoluble in alkaline developer. Therefore, a step is needed to prevent the neutralization of the acid before baking when a delay exists between the exposure stage, 103, and the PEB stage, 105. FIGS. 2C and 2D illustrate the effect a nitrogen ambient has on preserving the latent image.

Figure 3:
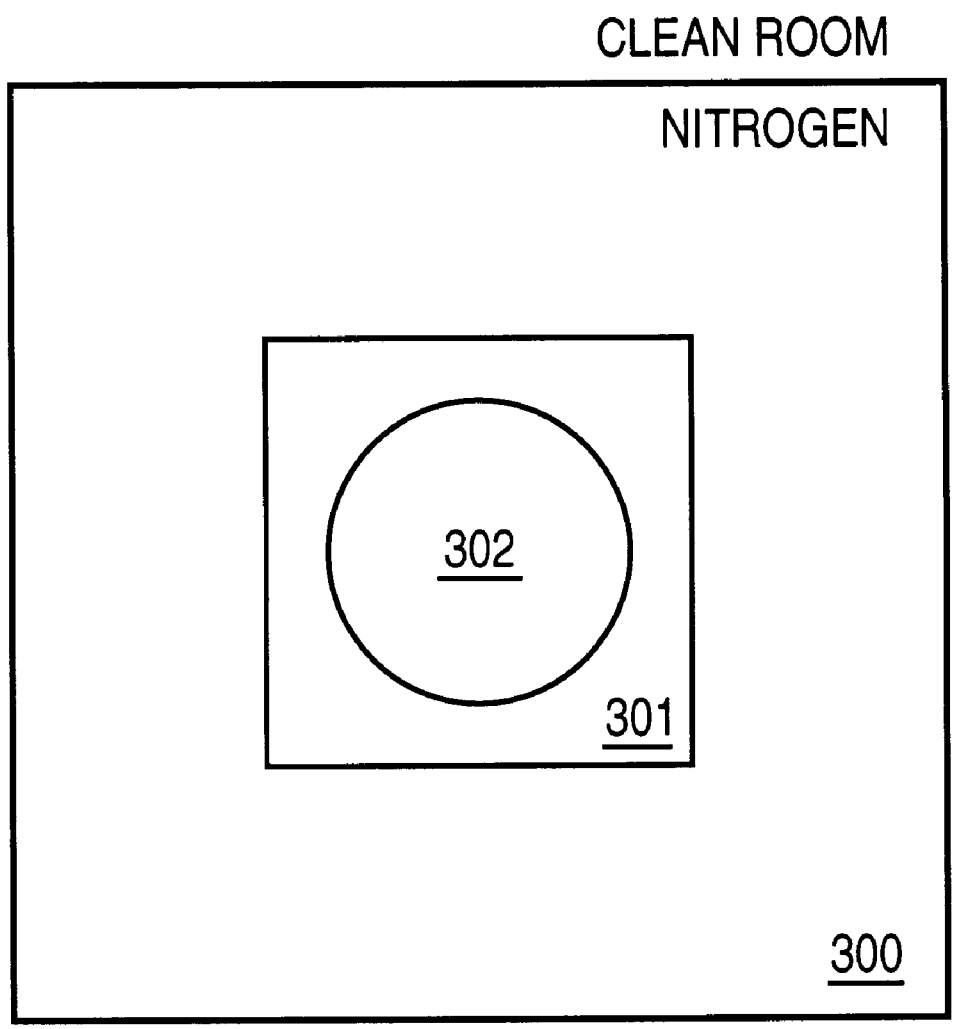
FIG. 3 illustrates one possible embodiment to the lithographic environment.

Post exposure treatment 104 follows exposure stage 103. In the prior art, after the wafer is exposed, the wafer and its photoresist are baked to stabilize the latent image. During the post exposure treatment 104, a variety of modifications to the scanner system and wafer storage and handling procedures are possible to prevent the acid from becoming ineffective. One such modification is that the wafer cassette used to hold the wafers during lithography process 100 could be modified to provide an inert gas ambient for the wafers after exposure. In one embodiment, as shown in FIG. 3, chamber 300 (encloses cassette 301 which receives exposed wafers 302 and controls the wafer ambient after the exposure. In the currently preferred embodiment, the wafer ambient is the inert gas nitrogen. The nitrogen atmosphere protects the acid from being subjected to the clean room ambient and being neutralized. Thus, the nitrogen atmosphere allows the post exposure stage 105 to facilitate the acid reaction to increase the solubility of the resins. Alternatively, the wafers can be stored in water, as opposed to an inert gas environment.

An alternative embodiment is to enclose the wafer handling portion of the stepper/scanner system. This allows the ambient to be controlled. This is accomplished using a simple enclosure around the wafer handling system. Nitrogen would then flow inside the chamber. Thus, the acid would remain protected from the clean room ambient.

Another possible embodiment is to provide a nitrogen ambient to the wafers during the exposure process. In this instance, the entire stepper environment chamber would contain nitrogen instead of air, which is currently used in most stepper/scanner systems. The utilization of nitrogen, instead of air, in the chamber impacts the stage control optics. The stages are calibrated to the refractive index of air. The difference between the refractive indices of air and nitrogen is 0.0000024. This minimal difference indicates that the actual path between the optics and the wafer should be affected slightly by nitrogen ambient. Therefore, replacing the air in the wafer ambient with nitrogen renders substantially the same results as exposing the wafer in an air ambient.

The post exposure treatment can also take a regenerative nature. After exposure, if a wafer containing a latent image is stored in a clean room atmosphere, placing the wafer in a nitrogen/inert gas ambient causes a regeneration of the latent image. Thus, the damage caused by the clean room ambient can be decreased. Where the delay before PEB is minimal, the latent image can almost regenerate to its original resolution.

Post exposure baking, stage 105, facilitates the catalytic reaction of the strong acid by adding thermal energy. The addition of the thermal energy accelerates the reaction. The reaction can be either acid catalyzed cross-linking (negative resists) or acid catalyzed deprotection (positive resists) wherein the blocking group, which acts as an inhibitor, is unblocked to render the resin soluble.

After post exposure bake stage 105, the resist and wafer are ready for developing, stage 106. Developing stage 106 allows the resist to leave an image behind which serves as a mask for etching, ion-implementation, lift off, etc. Typically, positive resist developers are water-based alkaline solutions developer systems. The resins dissolve in the alkaline solutions and, in so doing, leave an image to be used in the remaining fabrication the semiconductor wafer. Since the developers are water-based, they only require a water rinse to complete the developing stage.

After the wafer has been developed and inspected through the post baked process, the resist is subject to an elevated temperature. This step is referred to as the resist hardening stage 107. The purposes of resist hardening stage 107 are to remove residual solvents, to improve adhesion, and to increase the etch resistance of the resist.

Thus, a process for the post exposure treatment of a positive photoresist has been described.

We claim:

1. In a semiconductor fabrication process comprising the steps of:

coating a wafer with photoresist, said photoresist producing a photoacid when irradiated with radiation of a predetermined range of wavelengths, said photoacid catalyzing a chemical reaction when said photoresist is baked to increase the solubility said photoresist in the non irradiated areas with respect to the a solubility of said photoresist in the non irradiated areas;

irradiating said photoresist on said wafer with said radiation of a predetermined wavelength to generate said photoacid defining a latent image in said photoresist on said wafer, said irradiating step following said coating step;

preventing said photoacid from being neutralized by maintaining said wafer coated with said photoresist containing said latent image in water; and baking said latent image in photoresist on said wafer, said baking step following said preventing step.

2. The process as in claim 1, wherein said photoresist is a deep UV photoresist, said deep UV photoresist being responsive to radiation of a wavelength of 100–300 nm.

3. The process as in claim 1, wherein said photoresist is an I-line photoresist, said I-line photoresist being responsive to radiation of a wavelength of approximately 365 nm.

4. A process for forming a photoresist pattern comprising the steps of:

coating a wafer with a photoresist, said photoresist producing a photoacid when irradiated with radiation of a predetermined range of wavelengths, said photoacid catalyzing a chemical reaction when said photoresist is baked to increase the solubility of said photoresist in the irradiated areas with respect to the solubility of said photoresist in the non irradiated areas;

irradiating said photoresist on said wafer with said radiation of a predetermined wavelength to generate said photoacid defining a latent image in said photoresist on said wafer, said irradiating step following said coating step;

preventing said photoacid from being neutralized by maintaining said wafer coated with said photoresist in a nitrogen atmosphere, said preventing step following said irradiating step; and baking said latent image in said photoresist on said wafer, said baking step following said maintaining step.

5. The process as in claim 4, wherein said photoresist is a deep UV photoresist, said deep UV photoresist being responsive to radiation of a wavelength of 100–300 nm.

6. The process as in claim 4, wherein said photoresist is an I-line photoresist, said I-line photoresist being responsive to radiation of a wavelength of approximately 365 nm.

7. A process for forming a photoresist pattern comprising the steps of:

coating a wafer with photoresist, said photoresist producing a photoacid when irradiated with radiation of a predetermined range of wavelengths, said photoacid catalyzing a chemical reaction when said photoresist is baked to increase the solubility of said photoresist in the non irradiated areas;

maintaining said wafer coated with said photoresist in a nitrogen atmosphere, said maintaining step following said coating step;

irradiating said photoresist on said wafer with said radiation of a predetermined wavelength to generate said photoacid defining a latent image in said photoresist on said wafer, wherein said irradiation occurs in said nitrogen atmosphere, said irradiating step following said coating step;

preventing said photoacid from being neutralized by maintaining said latent image in said photoresist on said wafer in said nitrogen atmosphere, said preventing step following said irradiating step; and baking said latent image in said photoresist on said wafer, said baking step following said second maintaining step.

8. The process as in claim 7, wherein said photoresist is a deep UV photoresist, said deep UV photoresist being responsive to radiation of a wavelength of 100–300 nm.

9. The process as in claim 7, wherein said photoresist is an I-line photoresist, said I-line photoresist being responsive lo radiation of a wavelength of approximately 365 nm.

* * * * *